United States Patent

[11] 3,634,852

[72] Inventor Abutorab Bayati
Neureut-Heide, Germany
[21] Appl. No. 7,693
[22] Filed Feb. 2, 1970
[45] Patented Jan. 11, 1972
[73] Assignee Siemens Aktiengesellschaft
Berlin and Munich, Germany
[32] Priority Feb. 3, 1969
[33] Germany
[31] P 19 05 176.4

[54] ANALOG-TO-DIGITAL CONVERTER

7 Claims, 2 Drawing Figs.

[52] U.S. Cl. 340/347 NT, 340/347 CC, 324/99 D, 235/183
[51] Int. Cl. H03k 13/02
[50] Field of Search 340/347; 324/99 D; 235/183

[56] References Cited

UNITED STATES PATENTS

| | | | |
|---|---|---|---|
| 3,480,948 | 11/1969 | Lord | 340/347 |
| 3,525,093 | 8/1970 | Marshall | 340/347 |

OTHER REFERENCES

" Triple Play Speeds A- D Conversion" by H. Bent Aasnaes & Thomas J. Harrison; Electronics, Apr. 29, 1968, pages 69– 72

*Primary Examiner*—Daryl W. Cook
*Assistant Examiner*—Joseph M. Thesz, Jr.
*Attorney*—Edwin E. Greigg

ABSTRACT: A known process and apparatus for analog-to-digital conversion includes a storage circuit SP which includes a capacitor C which receives a charge corresponding to the voltage of an analog signal I to be measured, thereafter counts the change in charge of this circuit in two steps. During the first step of the process the stored circuit (SP) is discharged at a discharge rate adjusted to the coding rate. The discharge rate employed in the second step of the process is lower than the rate used in the first step. Accordingly, during the first step current from a source $S_1$ is applied to the storage circuit SP at a higher rate than in the second step and a correspondingly higher evaluation of pulses from a timing generator TG which are counted in a counter Z occurs, and during a second step the storage circuit SP receives current from a current source $S_2$ at a lower rate and a corresponding lower evaluation of pulses occurs. The expression "higher evaluation" means that the time-measuring impulses of the timing generator counted in the counter during the discharge of the first step of the process must have a greater weight than the impulses counted in the second step. To this end, counting impulses are added directly to counting stages of higher significance. This known apparatus is improved in the present invention by utilizing the current source $S_2$ as an additional voltage to be added to the analog voltage in storage, prior to the first step of the process, and in an amount controlled by the number of analog values to be converted in succession. At the same time as this additional voltage is added, a correspondingly evaluated number of counting pulses are delivered to the counter Z.

Inventor
Abutorab Bayati
by
Edwin E. Greigg

ANALOG-TO-DIGITAL CONVERTER

BACKGROUND OF THE INVENTION

This invention relates to a method and apparatus for analog-to-digital conversion, and more particularly to a method and apparatus in which the linearity of conversion is changed in accordance with the number of analog values to be converted in succession.

In my prior U.S. application Ser. No. 730,067, filed May 12, 1968, now abandoned, the disclosure of which is here incorporated by reference, there is disclosed a process and apparatus for analog-to-digital conversion. By reference to FIG. 1 of the present application, this prior application similarly includes a storage circuit SP having a storage capacitor C therein, which is charged to the extent of the peak voltage of an analog input signal. The capacitor is permitted to discharge and the time-linear change of the voltage is used to form digital circuits by use of a counter Z which counts the regularly recurring pulses from a timing generator circuit TG. In this prior application the action is improved by applying current at a first rate from a current source $S_1$, thus causing a higher evaluation of pulses so supplied. During the second step, current is supplied from a current source $S_2$ at a different rate. The effect of this is that a rough coded signal is first formed, and then this is adjusted by fine coding.

Under certain conditions it may be desirable to vary the differential linearity of this or similar apparatus depending upon the particular number of signals which are to be converted in succession. The term "differential linearity" indicates the relative difference in the channel width of the analog-to-digital converter. If the said converter is included as a component in a multichannel pulse height analyzer, the differential linearity is the main determinative factor for the classification of individual pulses in the proper channel.

Among the objects of the present invention is the provision of a method and apparatus for improving the differential linearity of analog-to-digital conversion.

Briefly stated, these and other objects of the invention are achieved by providing a method and apparatus in which the current source $S_2$, which normally serves for the second change in charge, may, prior to the first step of the process, be added as an additional voltage to the analog voltage in the storage at a rate controlled by the number of analog values to be converted in succession and, at the same time a correspondingly evaluated number of counting pulses from the timing generator TG is supplied to the counter Z.

DESCRIPTION OF THE PREFERRED EMBODIMENT

Figure 1:
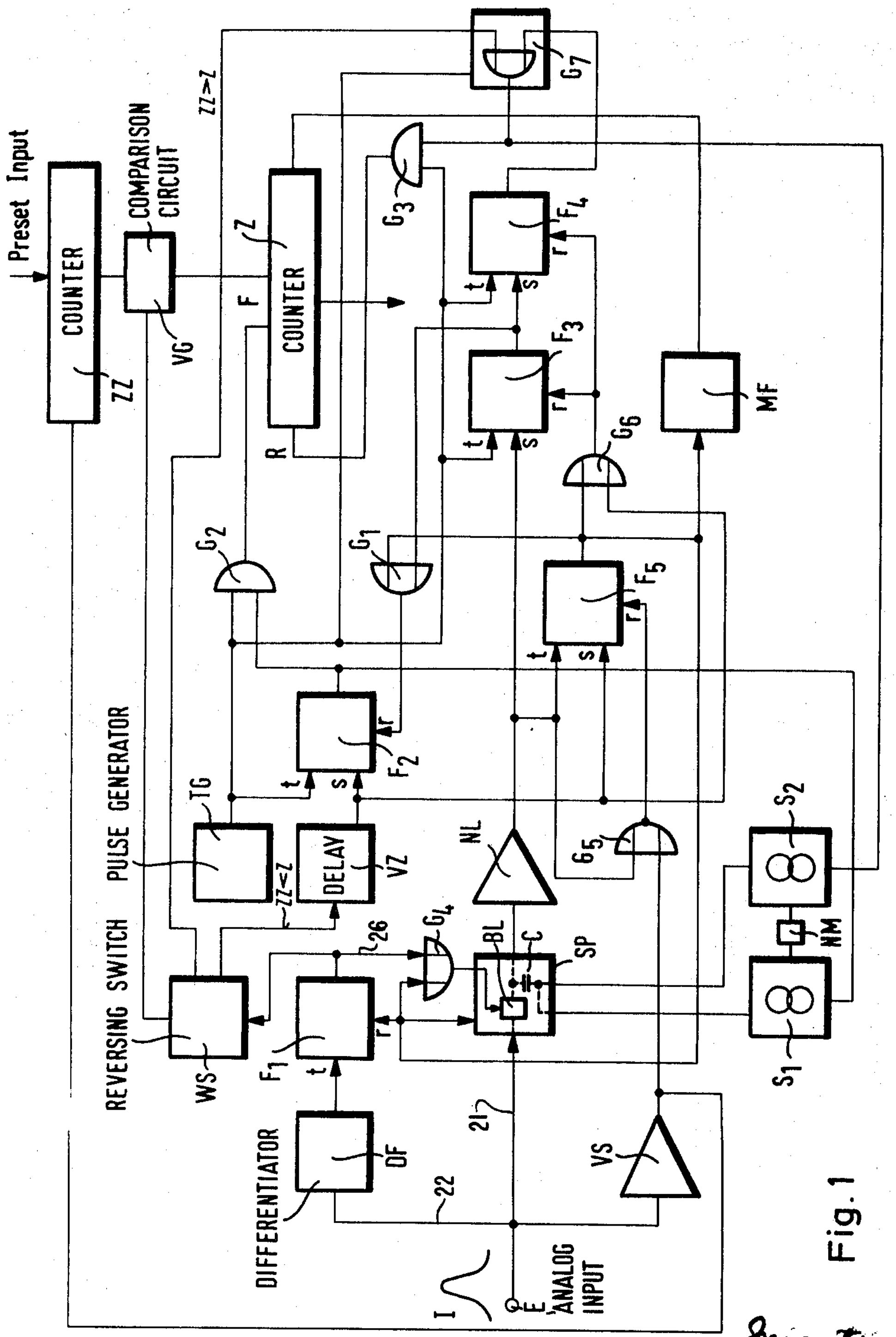
FIG. 1 is a schematic block diagram of a circuit according to the present invention.

Referring now to FIG. 1, it will be seen that an analog signal having a value I, which is to be converted to a digital signal, is delivered to an input E of an analog computer according to the present invention. Input E is connected directly to a storage circuit SP by a line 21 and charges a capacitor C therein to the peak value of the voltage to be measured. Other elements of circuit SP are indicated schematically by dotted lines. Storage circuit SP retains the charge for a certain time.

In addition, signal I is delivered by a line 22 to a differentiation circuit DF. Differentiation circuit DF supplies a pulse whose duration is constant and somewhat greater than the interval between two timing pulses delivered to the counter Z hereinafter described. The forward slope of the pulse from circuit DF is delivered at the same time as the maximum of the pulse I reaches storage circuit SP. This pulse is delivered to the *t* or triggering input of a triggering circuit $F_1$. The trailing edge of this pulse triggers a triggering circuit $F_1$ which has been previously set for receipt of this signal at the termination of the last conversion operation. The output of circuit $F_1$ is delivered over line 26 to an OR-gate $G_4$ to a blocking subcircuit BL which is part of the storage circuit SP. By means of this connection and on delivery of a first analog signal, storage SP may be blocked from receipt of further analog signals until the first signal is converted to a digital quantity. The arrangement of the differentiation circuit DF before the triggering circuit $F_1$ is a particularly effective way to accomplish this purpose. However, differentiation circuit DF may be omitted, especially if constant measured voltages and not pulse heights are coded.

The output pulse of triggering stage $F_1$ sets a triggering stage $F_2$. Advantageously, a delay circuit VZ is connected between triggering stages $F_1$ and $F_2$. Delay circuit VZ ensures that discharge occurs from the storage circuit SP only after it has been blocked from further analog inputs by the triggering stage $F_1$.

The output of triggering stage $F_1$ is connected to the input of delay circuit VZ through a reversing switch circuit WS. Switch circuit WS is controlled by a comparator circuit VG whose respective input terminals are connected to a counter Z and an additional counter ZZ, and which compares the contents of these two counters at any given particular time. If the contents of counter Z equals or is greater than the contents of counter ZZ the reversing switch connects the output of triggering circuit $F_1$ to triggering circuit $F_2$ so as to set it.

Triggering circuit $F_2$, once set, is actually triggered by timing pulses supplied by a timing generator circuit TG. Timing generator circuit TG produces pulses at precisely measured intervals. The actual triggering action occurs during passage of the trailing slope of the timing pulses. Timing generator circuit TG continually delivers pulses during the operation of the machine. Accordingly, circuit $F_2$ is triggered by the trailing edge of the next pulse which appears from it.

From this point on in the circuit the measuring action occurs synchronously with the timing pulses. One of the outputs of triggering circuit $F_2$ connects a current source $S_1$ to capacitor C within the storage circuit SP so that the discharge of the latter occurs with a constant current. Through the effect of delay circuit DZ the discharge from the storage circuit occurs only after storage is blocked from receipt of further analog signals to be measured by the triggering circuit $F_1$.

Up to the beginning of the discharge, the output voltage of the storage circuit SP is retained by storage capacitor C. According to the discharge law of a capacitor, the ratio of voltage reduction of storage circuit SP to the peak values stored within it which were supplied by the analog pulses I to be measured, remain constant during the time of discharge. For the same reason the delay time of the delay circuit VZ likewise exerts no effect on the result of measurement.

Another output of triggering circuit $F_2$ is delivered to an AND-gate $G_2$. The other input of AND-gate $G_2$ is connected directly to the timing generator. The output of AND-gate $G_2$ is connected to the forward input F of counter Z. Thus, once triggering circuit $F_2$ has been set by the appearance of an analog signal I, as previously described, all timing pulses thereafter produced by timing generator TG, which possess a very constant timing frequency, are delivered to the counter Z. Counter Z is a so-called forward-backward counter with two counting inputs. Pulses supplied over input F are added in the counter, while pulses supplied over input R are subtracted from the number in the counter. The timing pulses delivered to the input F are given a different weight factor than those supplied over input R.

This forward counting with the higher weight factor which began with the setting of triggering circuit $F_2$ continues until a negative value is reached by the output voltage of storage circuit SP. This output voltage is reduced in a linear manner through the discharge of its storage capacitor with a constant current from current source $S_1$. This discharge occurs through a null indicator circuit NL. On zero passage, the null indicator circuit delivers a setting signal to the *s* input of a triggering circuit $F_3$. The triggering input *t* of circuit $F_3$ is connected to receive timing pulses from the timing generator TG, and is so arranged that it is triggered by the appearance of the trailing edge of the next timing pulse appearing after the setting. The output of circuit $F_3$ is connected to the second triggering circuit $F_2$, through an OR-gate $G_1$. Accordingly, zero passage of the voltage from the storage circuit SP shuts off triggering circuit $F_2$ and stops forward counting since the AND-gate $G_2$ no longer receives an input from it.

Figure 2:
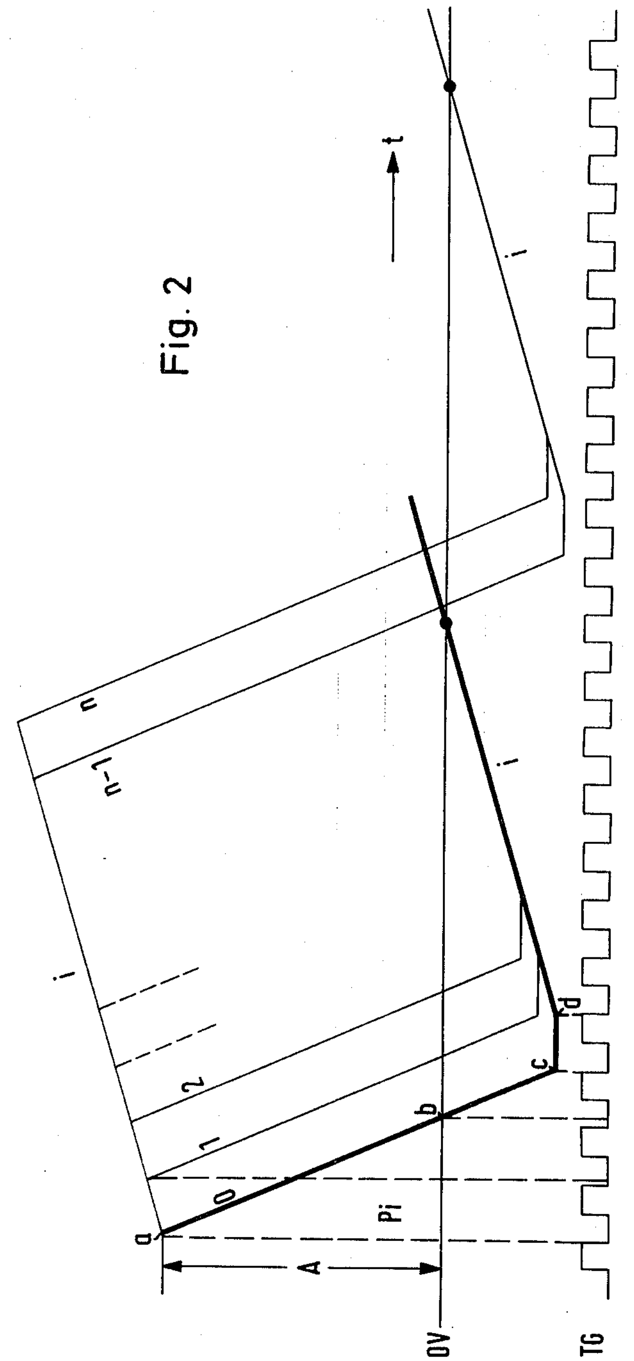
FIG. 2 is a graph illustrating the change in charge of a storage means according to the present invention that occurs with the passage of time.

This discharge procedure is illustrated in FIG. 2. In this graph vertical coordinates represent the voltage of the storage circuit SP at any particular time and the horizontal coordinates represent the time. Timing pulses delivered by a timing generator TG are shown extending horizontally below the graph. If an analog pulse I has a voltage of A and charges the condenser, the curve 0 shows the voltages at particular instances when a negative current $P_i$ is supplied from voltage source $S_1$ assuming that the comparator VG hereinafter described has had no effect. At point *a* discharge begins. The period of time represented by the first timing pulse from timing generator TG will have passed by that time due to the delay occurring in circuit DZ before triggering circuit $F_2$ is set. The next timing pulse is delivered to the forward counter F of the counter Z. Counting continues for three full pulses and is not stopped until a short period of time after the discharge voltage of storage circuit SP has passed through zero. During this period of time the storage circuit SP will have become negatively charged as indicated by the point *b* on curve 0. The counter now records three pulses.

The number 3 is, however, not sufficiently accurate for the desired analog conversion. The actual value of the signal is between 2 and 3. The amount of negative charge on the storage condenser is indicative of the quantity which must be subtracted from 3 to give a result of desired accuracy. Accordingly, accurate counting now occurs within counter Z by supplying timing pulses to its input R with the apparatus as hereinafter described.

In addition to shutting off triggering circuit $F_2$ the output of triggering circuit $F_3$ delivers a pulse to the *s* or setting input of a fourth triggering circuit $F_4$. Circuit $F_4$ is thereafter triggered by the appearance of the next timing pulse from the timing generator at its *t* input. This occurs at the point designated *c* on the curve 0. As before, it is the trailing edge of the timing pulses which triggers the triggering circuit $F_4$. The output of triggering circuit $F_4$ is delivered to an OR-gate $G_7$. The output of OR-gate $G_7$ is delivered to the input of an AND-gate $G_3$. The other input of AND-gate $G_3$ is connected to receive timing pulses from timing generator TG. The output of AND-gate $G_3$ is delivered to the reverse input R of counter Z.

The output of OR-gate $G_7$ is also connected to the control input of a current source $S_2$. Thereafter current source $S_2$ supplies a positive current to the storage SP. The current of current source may also be controlled by the other input of OR-gate $G_7$ which is connected with the reversing switch WS. The effect of this will be discussed at a later time.

The current from current source $S_2$ changes the charge of the storage capacitor within circuit SP. This current is smaller than the current $P_i$ from the source $S_1$ by the desired weight factor. The currents from the two sources $S_1$ and $S_2$ are compared to each other by means of a null indicator circuit NM and the difference is so adjusted that possible changes in the two current sources exhibit the same tendency and the ratio thereof constantly equals the weight factor.

Counter Z is counted backwards by the timing pulses until the output voltage of the storage SP is again positive. The zero passage is determined by null indicator NL. This point is shown by the letter *d* in FIG. 2.

A fifth triggering circuit $F_5$ has its triggering input *t* connected to the output of null indicator NL and is so arranged that it is triggered by the appearance of the first positive pulse supplied by the null indicator after previous delivery of negative indications. Triggering circuit $F_5$ has its setting input *s* connected to the delay circuit VZ, and will have been set by the delivery of an analog signal I to be measured, at the same time as the previously described second triggering circuit $F_2$. The output of circuit $F_5$ is connected to the reset input *r* of circuit $F_1$ and the reset inputs *r* of the other triggering circuits $F_2$, $F_3$ and $F_4$, and also to the storage circuit SP, the OR-gate $G_4$ and to a counterrelease circuit MF. The output of the fifth triggering circuit $F_5$ resets each of the other triggering circuits, causes the discharge of the storage circuit SP and blocks the storage SP for the receipt of further measuring pulses through OR-gate $G_4$. Desirably an OR-gate $G_6$ is connected between the output of the fifth triggering circuit $F_5$ and the reset input of the third and fourth triggering circuits $F_3$ and $F_4$. The other input of the OR-gate $G_6$ is connected to the output of the delay circuit VZ. The release circuit MF is a monostable multivibrator flip-flop which is always set for operation and which effects the release and clearing of the counter. The conversion process for a pulse to be measured is thus completed and all elements of the analog-to-digital converter are ready for the processing of the next analog pulse to be measured except triggering circuit $F_5$ and storage circuit SP. Triggering circuit $F_5$ holds the analog-to-digital converter in its blocked state by means of the OR-gate $G_4$ and must first be set back. The input pulse I, after being amplified in amplifier VS is applied to a NOR-gate $G_5$. The output of this NOR-gate is applied to the reset input *r* of the triggering circuit $F_5$. Accordingly, when no pulse I of sufficient intensity to deliver an output to the NOR-gate $G_5$ is present, and simultaneously no discharge occurs from the storage circuit SP to the other $G_5$ input, then an output is applied to reset triggering circuit $F_5$. Triggering circuit $F_5$ must be reset prior to the attainment of the peak value by the measuring pulse so that after the opening of the storage stage a sufficient time is still available for charging the storage to the peak value of the measuring pulse.

The triggering circuits $F_1$, $F_2$, $F_3$, $F_4$ and $F_5$ are a type of bistable circuit or flip-flops. The integrated switch circuits manufactured by Texas Instruments are particularly useful for this purpose. These flip-flop circuits can be triggered by either the forward or the trailing edges of pulse signals. The flip-flop circuits may be identical except that a flip-flop circuit $F_1$ differs from the others in that it does not possess a set input, but instead is always set so as to be actuated by a triggering pulse applied to its input *t*.

The two current sources $S_1$ and $S_2$ may be switching transistors having an appropriate voltage supplied to their base so that they draw a constant current. The transistors are of different conductivity types so that the current source $S_1$ tends to draw current from the condenser C of the storage circuit SP, while the current source $S_2$ charges this condenser. Accordingly, current source $S_1$ might, if desired, be called a current drain. These current sources deliver a steady direct current. However, the effect of this current on the capacitor charge is such as to apply a voltage variation on the capacitor of saw-tooth shape.

The null indicators NL and NM are of a well-known differential amplifier type. Essentially each consists of two transistors in which the base of one is charged with a reference voltage and the base of the other is charged with the variable voltage whose null passage is to be determined.

The blocking circuit BL can be any conventional circuit arrangement used for this purpose. For example, two switching transistors might be provided, one of which short circuits the input of the storage circuit SP, while the other separates the capacitor C from the input.

The operation of the comparator circuit VG and its associated circuits will now be described in greater detail. The two inputs of comparator circuit VG are respectively connected to the outputs of the two counters Z and ZZ. Counter Z is emptied prior to the start of each measurement. Counter ZZ may be of a type which resets itself automatically to zero when it reaches a preset number. This preset number can be set manually or through a programming device which is not illustrated. After the counter reaches this preset number and is reset to zero, counting continues automatically until it reaches the preset number and so on. The input of counter ZZ is connected to receive the analog pulses which are to be measured through the amplifier circuit VS. Prior to the start of a measurement, the contents of the two counters are equal. The output signal of comparator circuit VG appearing at the multiple switch sets it in such a manner that, when an analog signal is first delivered to it, its output is applied to the input of delay circuit VZ. Then, if an additional measuring pulse appears, it is taken into counter ZZ. Therefore, the two contents of the counter become unequal; the contents of counter ZZ exceeds that of counter Z. Comparator circuit VG then reverses the reversing switch WS.

The output of the first triggering circuit $F_1$ is now connected to the one input of OR-gate $G_1$.

The output signal of OR-gate $G_7$ now opens AND-gate $G_3$ so that the timing pulses from the timing generator TG are now applied to input R of counter Z. At the same time the output signal of OR-gate $G_7$ actuates current source $S_2$ that charges storage SP. Current source $S_2$ delivers a constant current causing a saw-tooth pulse of positive voltage to appear on condenser C. This signal adds to the charge which was applied by the initial analog signal I.

The application of current from source $S_2$ continues until the two counter states become equal. When the backward count within counter Z from input R has the same absolute value as the forward count in counter ZZ, the output signal of comparator circuit VG reverses, reversing switch WS. The output signal of the first triggering circuit $F_1$ is now again delivered directly to delay circuit VZ and the normal performance of the conversion sets in with the first step of the process. As can be seen in FIG. 2, if there is one additional analog signal to be converted, discharge occurs along curve 1. If two additional measuring pulses were to appear, storage circuit SP receives an additional voltage corresponding to the value of two pulses. At the same time two pulses are applied to the reverse input of counter Z in the manner described above. If the analog-to-digital converter is employed as a component of a multichannel pulse-height analyzer, presetting of counter ZZ may be selected in correspondence with a portion or the entire number of channels. For example, if counter ZZ is preset to number $n$, the analog-to-digital converter may perform $(n+1)$ various discharge procedures for processing an analog value A in accordance with FIG. 2. Such discharge procedures are performed successively in a sequence. The entire procedure is repeated after $(n+1)$ operations.

It will be apparent that there has been provided a method and apparatus in which every analog value to be converted is compared with a different position of the digital scale and the differential linearity errors present are thus detected.

The amount of the additional voltage to be added in each case to an analog value to be converted is determined by the comparison circuit VG which is controlled by comparing the counter content in counter Z with the content of an additional counter ZZ which always registers the particular number of analog values which are to be converted in succession. If desired, the additional counter can be preset manually and is reset automatically after it reaches the preset number.

The analog-to-digital conversion is performed in such a manner that, during the first step, the analog value storage is completely discharged and charged by the current source $S_1$ with a charge contrary in polarity to that of the analog signal I. The amount of this opposite charge depends upon the amount of time which passes from the time when the voltage of the storage circuit discharge reaches zero, and the time when the next timing pulse supplied by the timing generator TG arrives. In the next step this storage circuit is again discharged. During this second step the timing pulses are supplied to the reverse input R of the counter Z and are counted backwards. Furthermore, at the time of the zero passage of the voltage storage circuit SP from the positive value to the negative value, the counter input from the forward direction is blocked, the polarity of further charging of the storage circuit is reversed, the rate of change of the storage voltage discharge changes, and the counter input for counting pulses which have a corresponding lower evaluation coefficient is opened.

In order to realize this process, the input analog values are supplied to a first triggering circuit $F_1$ which blocks the analog value storage and, in turn, drives a second triggering circuit $F_2$ that connects a first current source $S_1$ to the analog value storage and opens the forward input F of the counter to count the pulses which correspond to a higher evaluation. The switches to accomplish the change from the first step of the process to the second step of the process include a third triggering circuit $F_3$ which is set by the null indicator NL and triggered by the timing pulses and which reverses the second triggering circuit. In addition, the switches for initiating the second step of the process include a fourth triggering circuit $F_4$ which is set by the third triggering circuit, is triggered by the timing pulses, and which opens the reverse counting input R of the counter Z through an AND-gate $G_3$ whose other input is subjected to timing pulses.

In addition, for the purpose of improving the differential linearity of the conversion, the previously disclosed arrangement is developed further in that the output of the first triggering circuit $F_1$ is connected to the input of a delay circuit VZ through a reversing switch WS whose other output terminal is connected to the AND-gate $G_3$ in front of the reverse input R of the counter Z through an OR-gate $G_7$ as well as to the control input of the current source $S_2$ serving for the remaining change in charge. The reversing switch WS is so controlled by the comparator circuit VG so that in the case where the content of the additional counter ZZ is greater than the content of the first counter Z, the output terminal of the multiple switch which is connected to the OR-gate $G_7$ is arranged to receive the output from the first triggering circuit $F_1$, and in the case where the content of the additional counter ZZ is smaller than that of the counter Z, the output terminal leading to the delay circuit VZ is connected to receive the output of the first triggering circuit $F_1$. Desirably OR-gate $G_7$ is synchronized by the timing generator TG through the AND-gate $G_3$.

By virtue of the present invention the successive analog values to be encoded are distributed sequentially over the entire encoding area of the analog-digital-converter and therefore are coded with a continuously changing number of encoding steps without reference to the fact as to how large the analog values in the encoding area are.

This is solely accomplished by the coordination of the additional counter ZZ with the counter Z through the comparator circuit VG, the reversing switch WS and the OR-gate $G_7$. The additional analog voltage added to the analog measuring value from the source $S_2$ is immediately considered by use of the backward input R of the counter Z. Consequently upon termination of the encoding process, the counter Z contains a digital value which corresponds exactly to the analog value I.

The improvement of the differential linearity is due to the fact that the single analog measuring values to be encoded are distributed in their encoding status over the entire encoding area. Thereby the errors in the single channel width can be determined. In counter Z, consequently after each encoding, the correct digital value is stored. Its output may be connected to a visual display device or a printer through any conventional means.

Although only one embodiment of the invention has been depicted and described, it will be apparent that this embodiment is illustrative in nature and that a number of modifications in the apparatus and variations in its end use may be effected without departing from the spirit or scope of the invention as defined in the appended claims.

That which is claimed is:

1. A method for analog-to-digital conversion comprising, in combination:

A. supplying an analog signal to be converted to a charge storage means (SP) with an electrical charge whose magnitude corresponds to the desired analog value, B. supplying regularly recurring pulses to a pulse counter to measure the time for a change in charge occurring during a first step at a rate higher than in a second step with a corresponding higher evaluation of the time for said change in charge, C. supplying the same pulses to the same counter to measure the remaining change in charge of said storage means during the second step at a lower rate and a corresponding lower evaluation of the time for said change of charge through the application of current to the storage means (SP) from a second current source ($S_2$), the improvement which comprises adding an additional voltage to said storage means (SP) prior to said first step from said second current source ($S_2$) in an amount controlled by the number of analog signals (I) to be converted in succession and, at the same time, supplying a number of timing pulses to the same counter, which number of pulses also corresponds to the number of analog signals to be converted.

2. The improved method of claim 1 including the step of:

A. registering the number of analog signals to be converted in succession in an additional counter (ZZ), and B. determining the amount of said additional voltage to be added to said storage means in accordance with the number of said analog signals which are registered by said additional counter.

3. The improved method of claim 2 including the step of automatically resetting said additional counter (ZZ) after it reaches a preset number.

4. In apparatus for converting analog values to digital values comprising, in combination:

A. means for storing an electric charge,

B. means for delivering an electric charge to said storage means whose quantity corresponds to an analog signal to be converted, C. means for measuring the time for change in charge thereafter occurring in said electric charge storage means during a first time period at a rate higher than in a second timing period and at a higher evaluation, D. means for measuring the time for remaining change in charge during a second time period at a lower rate and a corresponding lower evaluation during the second period, the improvement wherein means for evaluating the said remaining change in charge at a lower evaluation during said second time period comprises means for supplying an additional voltage charge ($S_2$) to said storage means (SP) in an amount corresponding to the number of analog values to be converted in succession.

5. The improvement of claim 4 wherein said means for measuring time include first counter means for counting pulses, and means for supplying cyclical pulses to said counter means during said first and second time periods and also at the same time as said additional charge is supplied to said storage means.

6. The improvement of claim 5 including additional counter means for counting the number of analog signals to be converted in succession and means for comparing the count in said additional counter means with the count in said first-mentioned counter means and for controlling the amount of said additional electric charge to be added to said storage means and the number of said cyclical pulses supplied to said counter at the same time as said additional charge is supplied.

7. The improvement of claim 6 including:

A. a first triggering means ($F_1$) for blocking said storage means (SP) from further storage of said analog values after a discharge by a first analog signal, B. a first current source ($S_1$) for supplying a charging voltage to said storage means (SP) to thereby give a higher evaluation to pulses produced while said current source is so connected, C. a second triggering means ($F_2$) connected to said first triggering means to be set thereby and connected to said timing pulses to be actuated thereby for connecting said first current source to said storage means and for opening a first input (F) of said first counter means (Z) to the receipt of said cyclical pulses, D. means for delivering a signal representing an intermediate level of charge storage at said storage means, E. a third triggering means connected to be set by said signal from said storage means and triggered by said counting pulses to reset said triggering means and for opening a second input (R) of said first counter means (Z) to receipt of timing signals, F. a fourth triggering means arranged to be set by said third triggering means and triggered by said timing pulses, G. comparator circuit means for comparing the contents of said first counter (Z) and said second counter (ZZ), H. reversing switch means (WS) actuated by said comparator means to deliver the output of said first triggering means to said second triggering means after a delay when the contents of said second counter means (ZZ) is equal to or smaller than said first counter (Z) and for delivering the output of said first triggering means to a second output when the contents of said second counter (ZZ) is greater than said first counter (Z), I. an OR-gate ($G_7$) having one of its inputs connected to said second output of said reversing switch means and its other input connected to said fourth triggering means, J. a second current source controlled by said OR-gate ($G_7$) to deliver a charging current to said storage means (SP) to thereby cause pulses counted during the discharge of said storage means while said second current source is connected thereto to have a lower valuation than pulses delivered when said first current source is connected thereto, and K. and AND-gate ($G_3$) having one input connected to said OR-gate ($G_7$), its other input to receive said timing pulses, and its output to said second input (R) of said first counter (Z).

* * * * *